United States Patent [19]
King

[11] 4,108,751
[45] Aug. 22, 1978

[54] ION BEAM IMPLANTATION-SPUTTERING

[76] Inventor: William J. King, 9 Putnam Rd., Reading, Mass. 01867

[21] Appl. No.: 803,571

[22] Filed: Jun. 6, 1977

[51] Int. Cl.$^2$ .......................................... C23C 15/00
[52] U.S. Cl. ............................ 204/192 N; 204/298; 118/49.1
[58] Field of Search .......................... 204/192 N, 298; 118/49.1, 49.5

[56] References Cited

U.S. PATENT DOCUMENTS

| 3,472,751 | 10/1969 | King ..................................... 204/192 |
| 3,732,158 | 5/1973 | Przybyszewski et al. ....... 204/192 N |
| 4,013,830 | 3/1977 | Pinch et al. .......................... 358/128 |

FOREIGN PATENT DOCUMENTS 2,410,483  9/1974  Fed. Rep. of Germany ...... 204/192 N

OTHER PUBLICATIONS

N. Ohmae et al., "Prevention of Fretting by Ion Plated Film", *Wear*, vol. 30, pp. 299-309 (1974).
R. G. Wilson et al., "Ion Beams", Wiley & Sons, N.Y. (1973), pp. 317-322.
D. M. Mattox, "Fundamentals of Ion Plating", *J. Vac. Sci. Tech;* vol. 10, pp. 47-52 (1973).

*Primary Examiner*—Aaron Weisstuch
*Attorney, Agent, or Firm*—Russell & Nields

[57] ABSTRACT

Material is deposited onto and implanted into a substrate by directing a beam of ions against a target, comprised of the material to be deposited, so as to sputter neutral particles and ionized particles from the target towards the substrate. The ionized particles are accelerated to energies sufficient to penetrate the substrate and be implanted therein and provide a strong bond. Sputter cleaning of the substrate surface by particles of sufficient energy also takes place.

13 Claims, 6 Drawing Figures

ION BEAM IMPLANTATION-SPUTTERING

BACKGROUND OF THE INVENTION

Many techniques are available for the deposition of thin and thick films of a large variety of materials on a large variety of substrates. For the successful transmission of the required coating material to the substrate, especially under "clean" conditions required for good bonding for many combinations, techniques have been developed for deposition under vacuum conditions. Among these techniques are evaporation, cathode sputtering, rf sputtering, ion plating, vapor decomposition and ion beam sputtering (see e.g. U.S. Pat. No. 3,472,751). In general these are relatively "thin" film techniques as opposed to "thick" film techniques such as painting, cladding, plating, etc.

In spite of this multiplicity of methods, there still exist many combinations of substrates and coating materials which cannot be successfully bonded to produce the required characteristics. Four of the primary reasons for such failures are:

1. Low melting or deformation point of the substrate material, restricting deposition conditions.
2. Softness (i.e., low binding energy) of the substrate material, reducing bonding strength.
3. Large differences in thermal expansion coefficients of the substrate and coating materials, restricting the useful temperature range of the combination to a narrow range around the deposition temperature unless the bond strength is very high.
4. Substrate is hard to clean, resulting in poor bond strength.

An excellent example of all four of these difficulties is given by the problem of applying a hard coating to plastics in order to provide scratch resistance. This is particularly desirable in the case of plastic eyeglass lenses, which are inherently safe to wear since they do not shatter but which easily become scratched and quickly reach a hazy condition requiring their replacement. The safety feature of such plastic lenses could be retained and the useful lifetime extended if it were possible to deposit a "hard" coating on the lens surface to protect it from scratching. In this context "hard" is taken to mean a coating of a material at least as hard as the normal optical glass used for eyeglasses. The plastics, however, used for eyeglass lenses (such as PC39, or CR39), although hard by plastics standards, are inherently difficult to clean and are soft by comparison with many other materials such as metals, glass or semiconductors to which coatings are conventionally applied, thereby making good bonds difficult to achieve. Also they may be worked only at low temperatures (maximum temperature approximately 70° C or less) and they have very high coefficients of expansion (approximately $8-9 \times 10^{-5}/°$ C) making them incompatible with most "hard" materials which must be worked at high temperatures and which have relatively small coefficients of expansion (less than $1 \times 10^{-5}/°$ C). In fact, fused quartz ($SiO_2$) which has a Mohs hardness of 7 and which is transparent in the visible spectrum would make an excellent protective coating for eyeglass lenses except that it has a coefficient of linear expansion of only $0.54 \times 10^{-6}/°$ C.

Basically it is desirable to use plastic to make eyeglass lenses because of the ease with which the basic blanks can be molded and because of their safety features, but it is desirable to apply a scratch resistant coating to extend the life. Many other similar applications are immediately obvious such as hard coatings for plastic safety windows, plastic instrument lenses (cameras, binoculars, etc.), plastic auto and airplane windows, etc. In addition, it is desirable to apply colored or reflecting layers to plastics for light control (sunglasses), for heat control (windows), for aesthetic reasons (decorative panels) etc., and also to apply hard protective coatings over such optical layers. Similar applications exist with other materials (e.g. applying solderable layers to boron nitride crystals, etc.). For purposes of the present invention, the eyeglass lens problem is intended to be illustrative only and is not intended to be limiting.

Coating materials such as organic compounds, which can be applied under low temperature non-vacuum conditions, at best provide marginal improvement over the basic plastic used in the lenses and do not compete in hardness with materials such as fused quartz or even common glass. In order to put down the latter at low temperatures, vacuum techniques must be used and even here most of the conventional processes do not work at low enough substrate temperatures to be compatible with plastics. The process of the present invention does, however, operate at the necessary low temperature and can be extended to large volume commercial production. It is a modified form of ion beam sputtering (for a description of the basic process, see U.S. Pat. No. 3,472,751).

BRIEF SUMMARY OF THE INVENTION

The present invention relates to improvements in the ion beam sputtering method of depositing a coating layer or layers onto a substrate, while keeping the substrate below its maximum working temperature. An objective of the present invention is to form an idealized integral composite substratecoating structure wherein the composition varies continuously from 100% substrate to 100% coating layer. A further objective of the present invention is to remove the contaminating film on the substrate surface, such that the film will not interfere with the bonding between the substrate and the coating layer.

A preferred method of the present invention contemplates focusing and accelerated ion beam (the primary beam) onto a target of material to be deposited onto the substrate. The primary beam of accelerated ions must be of sufficient energy to generate a secondary beam of neutral atoms or molecules and ionized particles sputtered from the target. The sputtered particles will travel primarily towards a substrate, and will be at such relatively low energies so as to form a coating layer. In order to effect an excellent bond between the substrate and the coating layer under adverse conditions, and in order to remove the contaminating surface film by sputter cleaning, a fraction of the particles sputtered from the target must be raised to higher energies. Therefore, an essential element of the present invention contemplates the application of an accelerating voltage to the sputtered ionized deposition particles. This objective is accomplished in one embodiment by depressing the potential of the substrate below ground via a power supply. The result is a significant penetration of said ions into the substrate, as well as a cleaning of the substrate surface by sputtering away the contaminating film.

An important feature of the method of the present invention is that only a fraction of the deposition particles, i.e. only the ionized deposition particles, sputtered from the target are accelerated to provide penetration. The remaining fraction of sputtered deposition particles are neutral atoms or molecules, whose energies are unaffected by the accelerating voltage. An equilibrium is, therefore, attained. The neutral particles are at lower energies providing a coating formation, while at the same time the accelerated ionized particles are at higher energies to provide surface cleaning and penetration. It should be noted that the penetration of the coating into the substrate results in a strong graded bond, as well as a graded thermal coefficient of expansion from substrate to coating layer. This grading effect due to penetration of coating layer into substrate is another objective of the present invention, to permit use of the composite structure over a larger temperature range.

A preferred apparatus of the present invention is constructed in accordance with the above objectives and specifications, to effect the preferred method of the invention. An important feature of the preferred apparatus is means for accelerating the sputtered ionized deposition ions. This means is preferably a variable power supply, such that the accelerating voltage can be either increased or decreased, left on for the entire deposition process or shut off earlier.

DESCRIPTION OF THE PREFERRED EMBODIMENTS

Figure 1A:
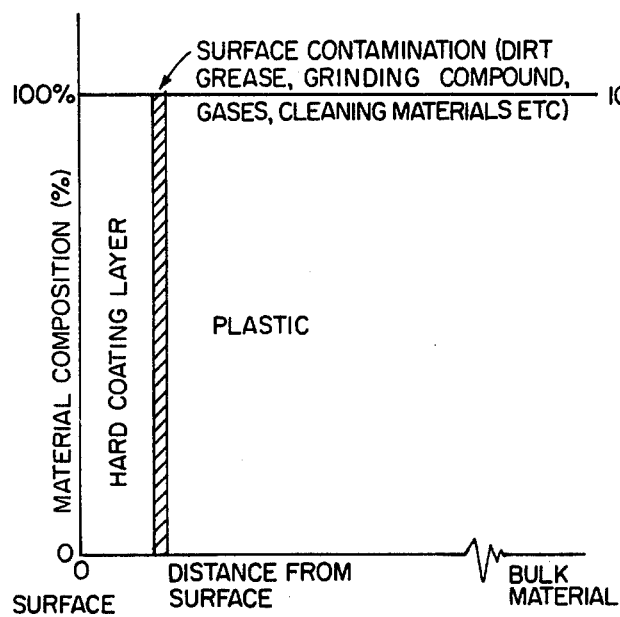
FIG. 1A is a schematic view showing the configuration of a substrate and surface-coating layer as a function of the distance from the exposed surface of said layer, with conventional coating techniques.
Figure 1B:
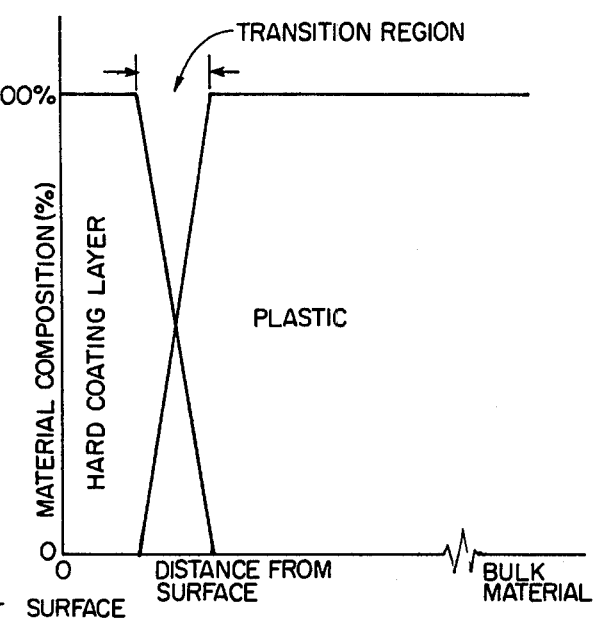
FIG. 1B is a schematic view showing the idealized configuration of a substrate and surface coating layer as a function of the distance from the exposed surface of said layer, said configuration approximated by one embodiment of the method of the present invention.

An understanding of the process and how it solves the problem of coating plastic eyeglass lenses with fused quartz is understood by referring to the general solution shown in FIGS. 1A and 1B.

FIG. 1A shows the normal situation when a layer of another material is put down on plastic by conventional techniques such as evaporation. Because of their organic nature plastics are very difficult to clean thoroughly since they are attacked by most conventional solvents. If detergents are used the problem remains of removing the residual detergent. An additional problem is caused by the low temperature restriction. Usually, therefore, there is an intermediate very thin layer of residual contamination between the deposited layer and the surface of the plastic resulting in an even weaker bond that would exist between the coating material and the plastic. Even if the bond is essentially directly between the coating and the plastic itself, it can be ruptured by thermal stress (at temperatures other than deposition temperature) since the stress will be applied at best over a bonding distance of only a few monolayers. If the coating materal is fused quartz, the difference in thermal expansion coefficients of more than two orders of magnitude between it and the plastic will break the bond for temperature excursions of tens of degrees centigrade.

The surface contaminants can be removed before layer deposition by slow ion beam milling or etching (i.e., slow sputtering process). This can be accomplished by various means of transporting the necessary energetic (100's of eV or higher energies) ions to the substrate including plasma etching, rf sputtering, etc, but in order to maintain absolute control of substrate temperature and etch rate, ion beam sputtering is the preferred method.

Once the surface contamination layer is removed, the problems of softness of the plastic and thermal mismatch can be solved by depositing the hard layer in such a manner that it penetrates significantly (10's to 100's of Angstroms) into the plastic as shown in FIG. 1B. With this structure the coating is continuously and integrally bonded to a much thicker layer of the plastic, increasing the strength significantly. In addition, under thermal excursions the stress due to thermal mismatch will be distributed over a much thicker layer, significantly reducing the resulting strain per atomic layer and thereby avoiding rupture of the bond. In effect the thermal coefficient of expansion is graded from that of the plastic to that of the hard layer over the transition region.

Figure 1C:
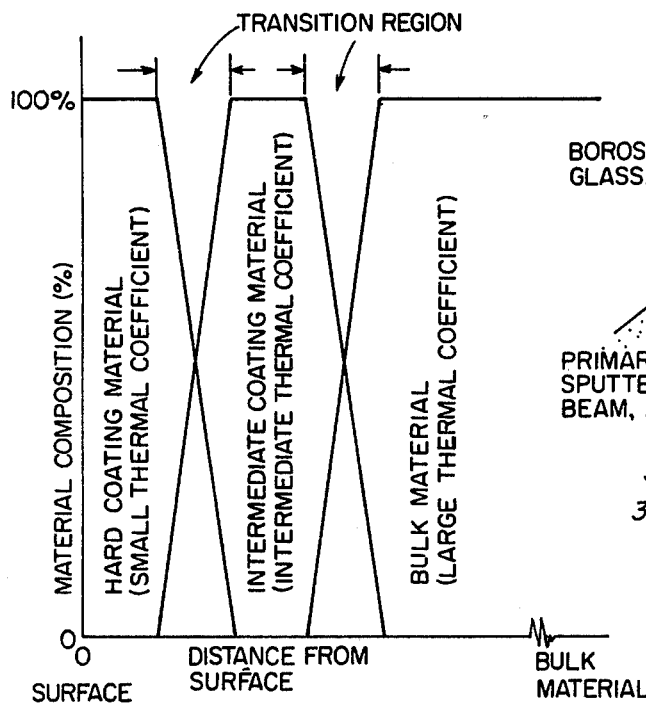
FIG. 1C is a schematic view showing the idealized configuration of a substrate with surface coating layer and an intermediate layer as a function of the distance from the exposed surface of the surface coating layer, said configuration approximated by one embodiment of the method of the present invention.

For applications requiring severe thermal excursions of the substrate-coating combination, the stress due to thermal mismatch may be further distributed by interposing an intermediate layer between the final coating and the bulk material as shown in FIG. 1C. The intermediate layer might be a clear common glass in the case of a fused silica hard coating if the total combination is to be transparent, a colored common glass in the case of a colored light absorbing lens, or a metallic reflecting or semi-reflecting layer is the combination is to be used for light and/or heat control as in reflecting windows. Many other applications will come immediately to mind to those skilled in the necessary arts. The substrates and coatings might even be reversed in characteristics as in the case of a softer, frictionless coating which has to be well bonded to a hard substrate.

An approximation to the basic configuration shown in FIG. 1B can be achieved by having the depositing atoms or molecules have sufficient energy to sputter clean the surface of the substrate and also sufficient energy to penetrate a significant distance into the bulk material (ten's of Angstrom's or more). The threshold energies for sputtering for most combinations of incoming ion and substrate material are in the 20–30 eV range, but removal of significant amount of surface material (i.e. yields approaching 1 atom/ion) are not usually achieved until incoming energies are in the order of 100's of eV's. Penetrations in the order of 10's to 100's of Angstroms by the oncoming ions are achieved with incoming ion energies in the 1–5 keV range. Higher energies give larger sputtering yields and greater penetration. Optimum energies for sputter cleaning without removing too much surface material and for sufficient penetration of the ions for good bonding will normally be in the 500 eV to 5 keV range although other values may be needed for specific substrate-coating combinations. Since the sputtering coefficients in this energy range are normally less than 10 and the penetrations are 10's of Angstroms, an equilibrium condition is reached at which the substrate surface layer is saturated with the depositing material and the deposit then builds as a coating on top of the composite layer. As further described hereinbelow, this equilibrium is attained due to the presence of a significant number of neutral atoms and molecules reaching the substrate and having a lower energy to provide strong surface bonding and formation of the coating layer. If, however, the overall sputtering coefficient at the substrate surface is greater than 1 there will be no build-up because the material will be removed faster than it is put down. As used above, sputtering coefficient is defined as the ratio of the number of ions, atoms, and molecules removed per number of incident ions.

The method by which this invention achieves the desired build-up as well as the necessary transitional composite layer is by having a combination of incoming atoms or molecules of material, some of which are energetic enough to penetrate to provide a strong bond, the others being of lower energy (approximately 50 eV) to provide strong surface bonding and bulk material but not being of sufficient energy to give significant substrate surface sputtering (i.e., sputter cleaning).

Figure 2:
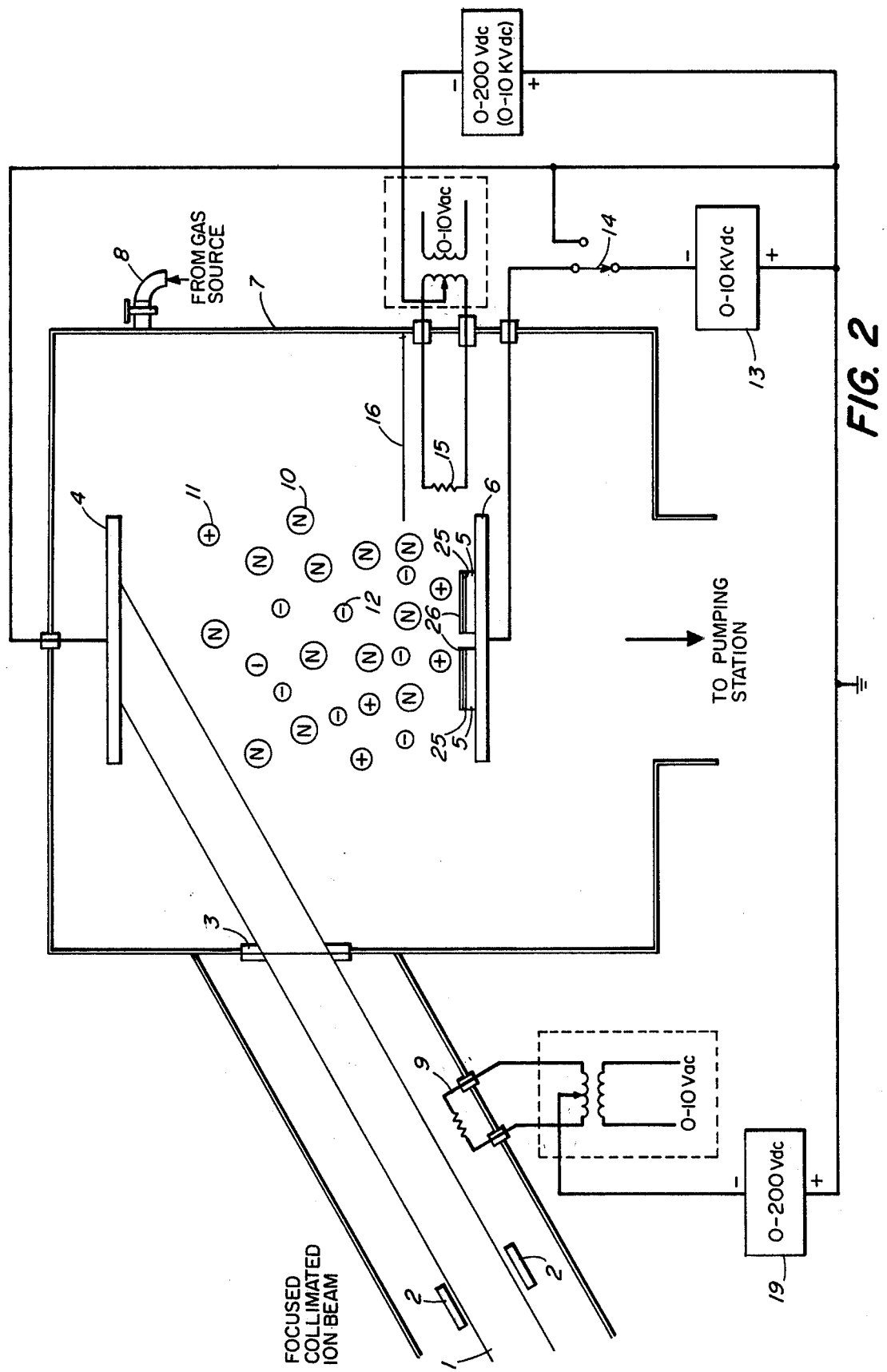
FIG. 2 is a schematic view of one embodiment of the apparatus of the present invention.

An apparatus for providing the necessary incoming depositing material is shown in FIG. 2. A beam 1 of energetic (0.5–50keV, usually greater than or equal to 20keV) noble gas ions (usually Ar or Kr) is focused by lens system 2 and preferably collimated by aperture 3 which is normally of the same material as that of the target 4 to prevent contamination. For the purpose of this invention, the beam 1 may be either focused or collimated, such that either the lens system 2 or the collimating aperture 3 can be omitted. Any ion source such as a duoplasmatron, low density (Kaufmann type) or other type may be used as the source of ions, as long as the beam is accelerated from the necessary potential relative to ground (or other target potential) to give the ions the necessary energies, and is properly controlled to be properly intercepted on the target. Filament 9 is heated by heater power supply 19 so as to emit electrons by thermionic emission for the purpose of neutralizing the positive ion beam 1 to prevent charge build-up on the target 4 when it is an insulating material. Other forms of neutralization can be used, and in general charge build-up is not in practice a problem.

Because of the high energy of the incoming sputtering ions, the number of atoms, ions or molecules sputtered from the target per incoming sputtering ion (i.e. the yield) is usually much greater than 1 for most combinations of sputtering gas and target material. Also because of the high energies, an appreciable fraction of the sputtered particles are ionized as they leave the target surface. This fraction increases with energy and is of the order of 2–5% at energies of 20 keV although smaller or larger (up to 10's of % have been observed) fractions occur with particular combinations of sputtering ion species, energy and angle of incidence and target material and structure. These sputtered particles, both neutral and ionized, have high average (of the order of 10–50eV) and maximum (approximately 100eV) energies. As shown in FIG. 2, a substrate 5 is placed on a substrate holder 6, and located in the path of the sputtered particles. It should be noted that the material sputtered from any small spot on the target 4, will have a slightly over-cosine distribution about the normal to the spot at the incident energies in question. In other words, a plot of the distribution of sputtered particles as a function of the difference angle between the normal to the spot and the direction of any sputtered particle shows a higher distribution when the difference angle is at or near zero than would a cosine distribution graph. The sputtered particles 10, 11 therefore have velocities primarily directed at the substrate 5, in the configuration shown. For a macorscopic beam as shown in FIG. 2, the distributions from all areas add to slightly flatten off the distribution at the substrate holder 6, which distribution is therefore peaked in the middle and falls off slowly to the sides. Other modifications can be made to make the distribution more uniform but these are unimportant to the present invention. If these energetic sputtered particles strike the substrate (or substrates) 5 on substrate holder 6 without undergoing collisions beforehand, they have sufficient energy to penetrate a few Angstroms, thereby penetrating through most surface contaminant layers and providing much better bonding than other techniques such as evaporation (particle energies less than 1 eV) or other sputtering techniques which occur in gas discharges which severely reduce particle energies (to approximately 1 eV average energy) due to multiple collisions before striking the substrate 5.

In the apparatus shown in FIG. 2, and in the basic ion beam sputtering apparatus, the target chamber 7 is evacuated to relatively high vacuum conditions (approximately $10^{-4}$ Torr) even during operation, so the mean free path ($\lambda$) of the sputtered particles is quite long. Approximate values of $\lambda$ are:

60 cm at $10^{-4}$ Torr
115 cm at $5 \times 10^{-5}$ Torr
290 cm at $2 \times 10^{-5}$ Torr
700 cm at $10^{-5}$ Torr From these values it can be readily seen that in a practical system the physical arrangement can easily be such that $\lambda$ is greater than the distance between the target 4 and the substrate 5 even at $10^{-4}$ Torr or more, although typical vacuum levels in practice are $5 \times 10^{-5}$ Torr or less. It is therefore not necessary in practice to reduce the operating vacuum level to ultra high levels (e.g. less than $10^{-5}$ Torr as in U.S. Pat. No. No. 3,472,751) to maintain the high average energy of the sputtered particles when they strike the substrate. In fact, the pressure in the chamber is sometimes deliberately raised by a few $10^{-5}$ Torr or more in the target chamber during deposition by the addition of $O_2$ or other reactive gases by means of valve 8. The use of $O_2$ during fused quartz deposition is done to ensure that the deposited material is not oxygen deficient.

As a result of the primary ion beam 1 incident on the target 4, a secondary beam of neutral atoms or molecules 10, a smaller number of sputtered ionized atoms or molecules 11, and a significant number of secondary electrons 12 are generated. Many of these have velocities towards the substrate 5 and will strike it in the absence of other factors. There are, of course, insignificant amounts of background contaminant gases except when $O_2$ or another gas is added to provide densification, etc. of the deposit.

As shown in FIG. 2, the substrate 5 will normally have a thin contaminating surface film 25. The problem which the present invention overcomes is the formation of a sufficiently tenacious deposit on a substrate, given this and other adverse conditions between coating layer and substrate discussed above. In order to form such a deposit, the idealized configuration of which is shown in FIG. 1B, some of the depositing particles must be raised to relatively high energies (in the range of 1–5 keV). As disclosed further below, the basic ion beam sputtering (IBS) method of U.S. Pat. No. 3,472,751 can be used as a satisfactory means for sputtering particles from a target 4 towards a substrate 5. However, in spite of the relatively high energy (approximately 50 eV) of the depositing particles sputtered by the basic IBS method, the energies are not high enough to provide the condition (FIG. 1B) required for extremely adverse combinations of substrate and coating layer. For such conditions, other methods yield unsatisfactory coating results.

On the other hand, if one attempts to directly deposit the required coating by ionizing the necessary deposition material (e.g. fused $SiO_2$) in an ion gun and accelerating the ions into the substrate, two problems arise. First, the materials such as fused $SiO_2$ which are desirable as coatings are extremely difficult to provide from an ion gun in commercial quantities. This arises because the material has a high melting point and a very low sputtering coefficient at the energies normally occurring in ion guns. Secondly, if the material were ejected directly from an ion gun, even if it were producible as ionized particles, all of the material would be of high energy (e.g. 1–5keV) if accelerated to provide the necessary penetration, and the overall sputtering coefficient at the substrate in most cases is such that more material would be removed than deposited.

In accordance with the present invention, the depositing material is provided by the basic ion beam sputtering process, because at the energies used (typically 20 keV) the sputtering coefficients of the target materials are such (yield of 600 amu/ion or greater) that there is an effective multiplication of 10 or more of the incident sputtering beam, i.e. each incoming 20 keV ion produces 10 or more lower energy sputtered particles. This is particularly important in the case of fused $SiO_2$ which has a very low sputtering yield below 5 keV but has a yield of approximately 10 $SiO_2$ molecules per 20 keV Ar ion.

In sum, therefore, the present invention contemplates the use of sputtered particles to form a tenacious deposit on a substrate, even under adverse layer-substrate conditions. These sputtered particles will be generated by the basic IBS process. But as previously discussed, if only the IBS process were used, the energies of the sputtered depositing particles would be too low for satisfactory results (idealized by FIG. 1B) under the adverse conditions. The present invention overcomes this problem, as discussed below.

After the secondary beam of neutral atoms or molecules 10, ions 11 and electrons 12 is generated, the substrate holder 6 (along with the substrate 5) is isolated in order that its potential may be depressed below ground by up to 10 kV by means of power supply 13. This power supply is turned on at the beginning of the deposition and adjusted to the necessary voltage to accelerate the sputtered ions 11 to the energies (approximately 1–5 keV) necessary to give penetrations in the order of 10's of Angstroms or more into the substrate 5. These ions 11 are therefore "implanted" into the substrate 5 rather than being combined with the substrate material through chemical efforts. The penetration into the substrate 5 is accomplished through the kinetic energy of the incoming accelerated ions 11 and can be obtained independent of the contaminating surface films 25 normally found on the substrates. Rather than forming bonds to dangling surface bonds of the substrate or surface films, the "implanted" deposited material forms bonds with internal substrate material. It should be noted that these bonds are not to be confused with graded bonds formed by chemical methods (dissolving, etc.). These ions 11 will therefore provide the bond depth and therefore strength (as in FIG. 1B) and because of their higher energies will sputter clean the surface film 25 of the substrate 5 at the same time. The addition of this accelerating voltage to the substrate 5 therefore serves a dual purpose in that it accelerates a fraction of the incident particles enabling them to provide cleaning during the initial film forming stages as well as greatly increasing bond strength. In general it is desirable (but not necessary) to have only substrate material exposed to the secondary particle beam in order to avoid sputtering of other materials back on the target 4 and from there to the substrates 5. One method would therefore be to line up the substrates in such manner as to avoid exposing the substrate holder to the depositing particles. Another method is to have the substrate holder 6 made of the same material as the target 4 so that material sputtered from the holder 6 will not contaminate the target 4. Also for some substrate materials it may be desirable to reduce the accelerating voltage to the level where there is insignificant sputtering, to avoid surface deterioration, etc. It is important to recognize that any accelerating voltage which gives the accelerated secondary ions 11 more energy than they would have on the average (approximately 50 eV) without the accelerating voltage, will improve the bond even if the energy of the ions 11 is too low to give significant surface cleaning (e.g. accelerating voltage of 200 V for some materials).

As shown in FIG. 2, the method of the present invention can be carried out with one or a plurality of substrates 5 within the target chamber 7. Such a plurality of substrates would be the preferred method for commercial manufacturing.

It is very important to recognize that this entire process can be carried out while maintaining the substrate 5 at temperatures below the maximum working temperature (approximately 70° C) of most plastics. The technique in fact operates at substrate temperatures well below those of other methods because the only energy incident on the substrate is that carried in by the "working" material.

It is important to note that the neutral atoms or molecules 10 which constitute the major part of the secondary beam are unaffected by the accelerating voltage on the substrate 5 and continue to arrive at the substrate in the same numbers and with the same energies (approximate average energy of 50 eV) as if the accelerating voltage were not present. As noted above, these energies are not high enough to result in significant sputter cleaning. More material is therefore arriving on the substrate than is being sputtered clean because of the much larger number of neutral atoms or molecules than accelerated ions. There is therefore an coincidental occurence of the surface cleaning, bond formation, and coating formation.

In some primary beam configurations where the beam is large or intense, it is possible that "some" of the material sputtered from the target by the primary beam may undergo some scattering collisions in passing through the "relatively" dense gas in the primary beam. Under these conditions, the presence of the accelerating voltage for the ions 11 in the secondary ion beam will compensate for any average loss in energy of the sputtered particles and in fact will significantly improve the average energy over that existing if the secondary beam particles did not pass through the primary beam. This fact can be important in designing large commercial systems. It is also noteworthy that the percentage of ions 11 in the secondary beam (comprising 10, 11, and 12) can, for some combinations, go up after passing through the primary beam 1 because of "stripping" effects. In systems in which the ambient gas pressure goes up to relatively high values (e.g. greater than $10^{-4}$ Torr) during deposition, it may even be desirable to keep the accelerating voltage on during the entire deposition process (neutralizing the positive charge build-up on substrate 5 during deposition as described below).

The optimum bond conditions are achieved in a relatively short time (compared to total run time) since the formation of the coating or deposition layer 25 causes the accelerated ions to penetrate the deposited coating 26 but not the substrate material. It should be noted that a contaminating film 25 will be mostly if not completely sputter-cleaned away by the time the deposition layer 26 has been completely deposited, and FIG. 2 should be viewed with this fact in mind. In order to avoid excessive charge build-up in the deposited layer 26, the power supply 13 is turned off after the bond is formed and the substrate holder 6 is connected to ground through switch 14. Alternatively this power supply may simply be turned off if its output is automatically grounded when it is off. With the substrate grounded, electrons 12 (which were repelled when the power supply was on) will once again reach the substrate 5, and may even be attracted to the substrate 5 if a significant positive charge has built up in the substrate during acceleration of the positive ions 11. Although not normally necessary, the neutralization of the positive charge on the substrate 5 can be accomplished by means of an electron emitting filament 15, shielded from the secondary beam by baffle 16. Other similar techniques may be used. (Contamination from the filament should be insignificant for the times involved, but can be avoided by well known techniques if necessary.) A simple but effective method is to use an AC high voltage power supply swinging on both sides of ground potential during bond formation, alternately attracting positive ions and electrons. This would definitely maintain neutraliy under any condition but add complexity to the system.

In the case of a two layer coating, as in FIG. 1C, in which the intermediate layer is a metal, charging effects due to the accelerated ions will be minimized or completely eliminated, depending on metal thickness, etc. In fact, even in the case where a clear coating such as fused $SiO_2$ is to be deposited, a few monolayers of a suitable metal (Ni, Cu, etc.) could be accelerated into the substrate beforehand in order to aid in the removal of subsequently deposited charge since in such small amounts almost no light absorption is apparent.

Also in the case of the two layer coating as in FIG. 1C, it may be desirable or necessary to apply the accelerating voltage to the substrate during the transition from the intermediate layer to the final layer. However for materials which form strong bonds under the simpler basic ion beam sputtering technique (e.g. fused silica on borosilicate glass) this complication is sometimes not required. For the purposes of this invention, it is to be understood that the accelerating voltage may be applied during the deposition and implantation of any layer of material onto another layer of material, regardless of the nature of the material or materials and regardless of the total number of layers comprising the final composite structure.

Figure 3:
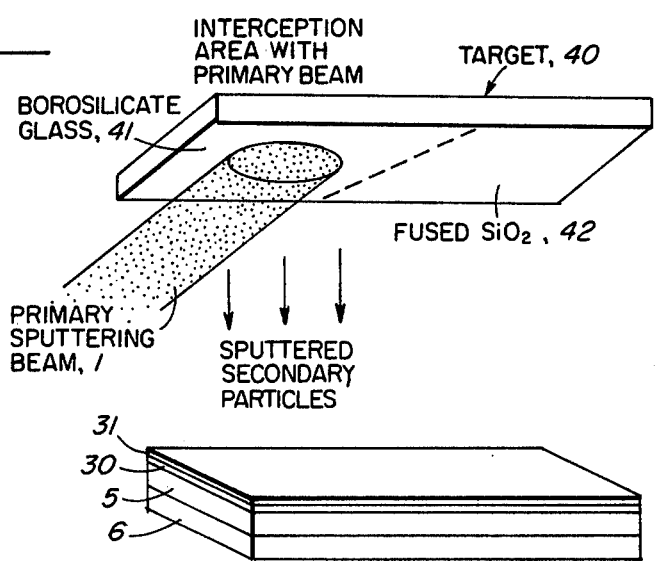
FIG. 3 is a perspective view of another embodiment of the target and multi-layer coated substrate of the present invention.

In addition, for the bond between the intermediate layer and the final layer it is possible to employ another technique leading to even better bond strength and eliminating the need for an acceleration voltage during the initial stages of bond formation. With respect to FIG. 3, using borosilicate glass (intermediate layer 30 on substrate 5) and fused silica (final layer 31 on substrate 5) as an example, if the target 40 inserted in the primary target beam 1 is split in such a manner that the relative composition of the borosilicate glass and the fused silica can be continuously changed from 100% of one to 100% of the other, the transition layer can be continuously varied, completely integral, and can duplicate the ideal condition shown in FIG. 1C. As shown in FIG. 3, the target 40 can be so constructed whereby approximately half is of intermediate material (e.g. borosilicate glass) 41 to be deposited as the intermediate layer 30 and the remaining half is of final material (e.g. fused $SiO_2$) 42 to be deposited onto the substrate as the final layer 31. The boundary of the two materials 41, 42 on the target is angled such that the desired continuous change in amounts of materials deposited can be attained as the location of the primary beam 1 on the target 40 is changed. If the intermediate layer 30 is formed with the target 40 in the position shown (accelerating voltage can be used for first bond), after enough borosilicate glass from the target has been applied, the target can then be moved to the left, relative to the location of the primary ion beam 1 on said target, at a speed necessary to make the transition region of the desired thickness. The transition region will then vary continuously and uniformly from 100% borosilicate glass to 100% fused $SiO_2$. Finally, the system is run with the primary beam completely on the fused $SiO_2$ portion 42 of the target to build up the necessary $SiO_2$ layer thickness. Any other materials can, of course, be used in this technique which can also be used with three or more materials, and many other target configurations can be used to provide the transition. This technique can also be used to deposit homogeneous mixtures of materials by having the target divided in the proper proportions. The present invention is not limited to any particular configurations of the target or materials on the target.

Many elemental materials and compounds can be sputtered and transferred by the basic ion beam sputtering technique. In particular, fused $SiO_2$ can be sputtered quite readily and transfers in a basically molecular form, forming a deposited layer with characteristics (including transparency) of bulk fused silica. It therefore is an excellent choice for the hard coating desired on plastic lenses except for the differences in thermal expansion coefficient. Other good coating materials are $Al_2O_3$, Corning 7070 and 7740 glasses, and borosilicate glasses, as well as other materials obvious to those skilled in the art. The plastics in general, however, lend themselves to the exploitation of the present invention because of their large complicated molecules. Contaminant gases, etc. on the surface of a plastic substrate will be preferentially sputtered during the cleaning stage because of their smaller size and/or smaller surface bonding. Because of the low density of the plastics, penetration by the "accelerated" ions will be quite significant at relatively low energies leading to increased bond strength. Most importantly, this can be done while keeping the substrates below the maximum working temperature.

Figure 4:
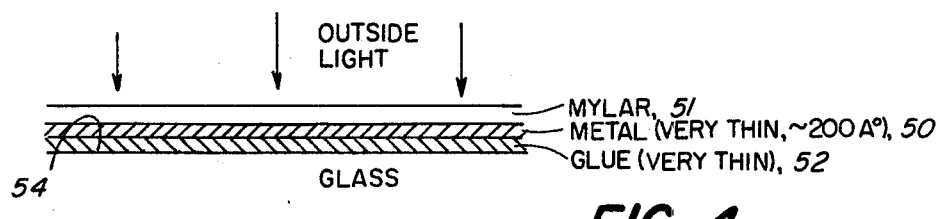
FIG. 4 is a cross-sectional view showing a composite of a Mylar layer and a metal semi-reflecting film deposited by the method of the present invention onto said Mylar layer, said composite being glued to the outside surface of a pane of glass.

With respect to FIG. 4, a particularly useful configuration of a metal semi-reflecting film 50 on a low temperature material is on Mylar (or similar materials) film 51 which can then be glued by means of transparent glues 52 such as silicons to the outside surface 54 of ordinary glass windows. Using conventional methods, it is very difficult to get a sufficiently good bond of the metal to the Mylar, to allow it to be "handled" for such applications. The present invention allows this use. The ultimate purpose is the retrofitting of office, factory and home windows for thermal control and energy conservation. These composite films could also be applied at the factory level to window glass, or the reflecting layer 20 can be deposited directly to the glass as with other methods. The reflecting Mylar can also be used for making bubbles (such as are used for tennis courts) with the outside reflecting for thermal control.

Referring again to FIG. 2, during the period the accelerating voltage is applied to the substrate 5, a field exists between the substrate holder 6 and the target 4. The incident primary Ar or Kr ion beam 1 passes through a small part of the field and can be deflected by an amount which will be minor since the incident beam is very energetic (approximately 20 keV) while the field it passes through represents only approximately 1 kV of potential. This minor deflection, if it occurs, can be adjusted for, if necessary, by altering the initial angle of the primary ion beam, moving the target, etc. and it does not materially affect the basic processes.

All of the voltages, etc. and the physical configurations shown in FIG. 2 are illustrative only. Many other configurations could be used to operate the process without modifying the basic concepts. Actual voltages, etc. are dependent on the materials and substrates being used. Other electronic components (current meters, power supplies, etc.) are present in a real configuration which are not necessary to the present description of the invention and are therefore not shown.

Although this invention has been described in detail with reference to the presently preferred embodiments, it is contemplated that modifications will occur to those skilled in the art and familiar with the principles herein disclosed, and that such modifications may be made without departing from the scope of the invention. In addition, while the invention is generally described as utilizing a beam of ions of an inert gas, it should be noted that the effect of the neutralizing filament 9 is to add electrons to the positively charged ion beam, to neutralize it, through the formation of atom particles. The formation of ions is necessary for electrostatic acceleration, but for bombardment purposes it is immaterial whether the particles are charged ions or neutral atoms. Also, it is to be understood that the scope of the present invention extends to a negatively charged ion beam. The only requirement of the primary ion beam is that it comprises accelerated ions, either positively or negatively charged, which may or may not be neutralized in whole or in part before reaching the target.

I claim:

1. Method of depositing onto and implanting into a substrate at least one layer of at least one material comprising directing a primary beam of ions at a target surface of said material at an energy sufficient to sputter neutral atoms and molecules and ionized particles from said target surface material, placing a surface of said substrate in the path of said neutral atoms and molecules and ionized particles, and accelerating said ionized particles towards said substrate surface, thereby increasing the penetration of said particles into said substrate.

2. Method of claim 1 wherein said ionized particles are accelerated by means of an adjustable accelerating voltage.

3. Method of claim 1 wherein said ionized particles are accelerated to an average energy providing significant implantation into said substrate.

4. Method of claim 3 wherein said average energy of said accelerated ionized particles is within a range yielding an equilibrium condition defined by a simultaneous occurrence of said depositing, said significant implantation, and sputter cleaning of said substrate surface.

5. Method of claim 1 wherein said substrate is composed of plastic material and said target surface is of a material selected from the group comprising $SiO_2$, $Al_2O_3$, Corning 7070 and 7740 glasses, and borosilicate glasses.

6. Method of claim 1 wherein said primary beam comprises accelerated ions of a noble gas.

7. Method of claim 1 wherein said neutral atoms and molecules have an average energy in the range of 10 to 50 eV, and said ionized particles are accelerated to an average energy in the range of 200 eV to 5 keV.

8. Method of claim 1 wherein a first layer and a second layer are deposited onto and implanted into said substrate, and wherein said substrate is composed of plastic material, said first layer is a metal, and said second layer is $SiO_2$.

9. Method of claim 2 wherein said accelerating voltage is in the range of 0 to 10 kV and is adjustably applied by electrically connecting the substrate with a power supply, said voltage being adjustable in amount and duration during the depositing and implanting of said layer.

10. Method of claim 2 wherein substantial accumulation of charge on the substrate is prevented by interrupting said accelerating voltage and grounding said substrate.

11. Method of claim 1 wherein a first layer of first material and a second layer of second material are deposited onto and implanted into said substrate, and wherein said first layer material and second layer material are spatially arranged on the target surface in such a manner that as the location of said primary beam on said target surface is changed the relative composition of said first and second layers is continuously and integrally varied from 100% of said first layer to 100% of said second layer.

12. Apparatus for ion beam sputtering comprising in combination support means for a substrate, means for directing a primary beam of ions at a target at an energy sufficient to sputter neutral particles and ionized particles from said target towards said substrate, and means for accelerating said ionized particles towards said substrate thereby increasing the penetration of said particles into said substrate.

13. Apparatus of claim 12 wherein said means for accelerating comprises a direct current voltage applied to said substrate.

* * * * *